United States Patent
Besler et al.

(10) Patent No.: US 6,232,555 B1
(45) Date of Patent: May 15, 2001

(54) CRIMP CONNECTION

(75) Inventors: Martin Besler, Nuremberg; Harald Lutsch, Robtal; Armin Studt, Erlangen, all of (DE)

(73) Assignee: Framatome Connectors International, Courbevoie (FR)

( * ) Notice: Subject to any disclaimer, the term of this patent is extended or adjusted under 35 U.S.C. 154(b) by 0 days.

(21) Appl. No.: 09/265,615

(22) Filed: Mar. 10, 1999

(30) Foreign Application Priority Data

Mar. 19, 1998 (DE) .............................. 198 12 093

(51) Int. Cl.⁷ ...................................... H01R 4/00
(52) U.S. Cl. ............................................. 174/84 C
(58) Field of Search .................. 174/84 C, 84 R, 174/74 R

(56) References Cited

U.S. PATENT DOCUMENTS

| | | | |
|---|---|---|---|
| 3,696,322 | * 10/1972 | Spangler et al. | 339/97 C |
| 3,758,703 | * 9/1973 | Golden et al. | 174/84 C |
| 3,767,841 | * 10/1973 | Anderson et al. | 174/84 C |
| 3,916,085 | * 10/1975 | Hansen | 174/84 C |
| 4,012,101 | * 3/1977 | Damoisiaux et al. | 339/97 |
| 4,304,454 | * 12/1981 | Yokota et al. | 339/97 |
| 4,714,801 | * 12/1987 | Kolilitz et al. | 174/88 R |
| 5,004,869 | * 4/1991 | Koblitz et al. | 174/84 C |
| 5,110,387 | * 5/1992 | Jasinski et al. | 156/222 |
| 5,164,545 | * 11/1992 | Kreinberg et al. | 174/94 R |
| 5,342,996 | * 8/1994 | Ito | 174/84 C |
| 5,484,305 | * 1/1996 | Diniz et al. | 439/421 |

\* cited by examiner

Primary Examiner—Dean A. Reichard
Assistant Examiner—William H Mayo, III
(74) Attorney, Agent, or Firm—Perman & Green, LLP

(57) ABSTRACT

A crimp connection between a flexible flat contact part (1) and a crimping ferrule (2) enclosing this contact part (1), wherein the crimp connection is characterized in that the crimping ferrule (2) has a base (3) and two side plates (4a, 4b) adjoining the base on opposite sides. The base (3) has at least one groove (6) towards the interior of the ferrule and transversely to the longitudinal ferrule axis (5), and ribs (7) arranged at the free ends of the side plates (4a, 4b). The ribs at the free end are disposed in such a way that, after crimping has taken place and with the side plates (4a, 4b) rolled in towards the interior of the ferrule, the said ribs press the flexible contact part (1) into the corresponding groove (6) and engage with the said part essentially positively into the corresponding groove (6).

13 Claims, 7 Drawing Sheets

CRIMP CONNECTION

BACKGROUND OF THE INVENTION

The present invention is based on a crimp connection designed according to the precharacterizing clause of the main claim. It relates in particular to a crimp connection for establishing a connection between two flexible printed-circuit boards, two flexible flat-ribbon lines or else a flexible printed-circuit board and a flexible flat-ribbon cable.

Required for this purpose is a crimping ferrule, in which the line to be connected is located. A crimping tool which deforms the crimping ferrule in such a way that a direct (galvanic) contact is established between conductor and crimp connection is generally used.

A crimp connection corresponding to the precharacterizing clause of the main claim is disclosed by the U.S. Pat. No. 3,696,322. Presented here is a crimp connection in which the ends of the side plates of this crimping ferrule have serrations which, during crimping, are bent back in a U-shaped manner and are pressed into the conductor and thus produce the contact. Such crimp connections have the disadvantage that they contact the conductor in a punctiform manner and consequently are designed only for low currents. Furthermore, in particular if the material of the side plates of the crimping ferrules relaxes, this may have the result that the contact between conductor and crimp connection becomes loose over time and finally fails completely.

The present invention is based on the object of improving a crimp connection of the type described at the beginning in such a way that it is likewise designed for high current applications and, nevertheless, the connection remains fully serviceable even in the possible event of material fatigue.

This object is achieved by the features specified in the characterizing clause of the main claim.

BRIEF SUMMARY OF THE INVENTION

The crimp connection establishes a connection between a flexible flat contact part and a crimping ferrule which encloses the latter and has a base and two side plates which extend upwards from the base. Furthermore at least one groove is recessed in the base towards the interior of the ferrule and transversely to the longitudinal ferrule axis. The free ends of the side plates have ribs. After crimping has taken place, the side plates are rolled in towards the interior of the ferrule, with the result that ribs located on the said side plates press the flexible contact part into the corresponding groove. At the same time, the flexible contact part engages essentially positively into the corresponding groove.

In the case of such crimp connections, it is particularly advantageous, on account of the positive connection between contact part and crimping ferrule, that not only an outstanding electrical connection but also a mechanically robust connection which withstands high tearing-out forces is established. Furthermore, this crimp connection may be used for conventional and existing methods of crimping. What is more, because of the spiral-shaped side plates of the crimping ferrules, it is ensured that, in spite of relaxation of the crimping material (material fatigue, relaxation, deformation), the electrical and mechanical properties of the crimping connection are approximately preserved. Advantageous developments are specified in the subclaims and are explained in more detail with reference to the exemplary embodiment represented in the drawings, in which:

DETAILED DESCRIPTION OF THE INVENTION

Figure 1:
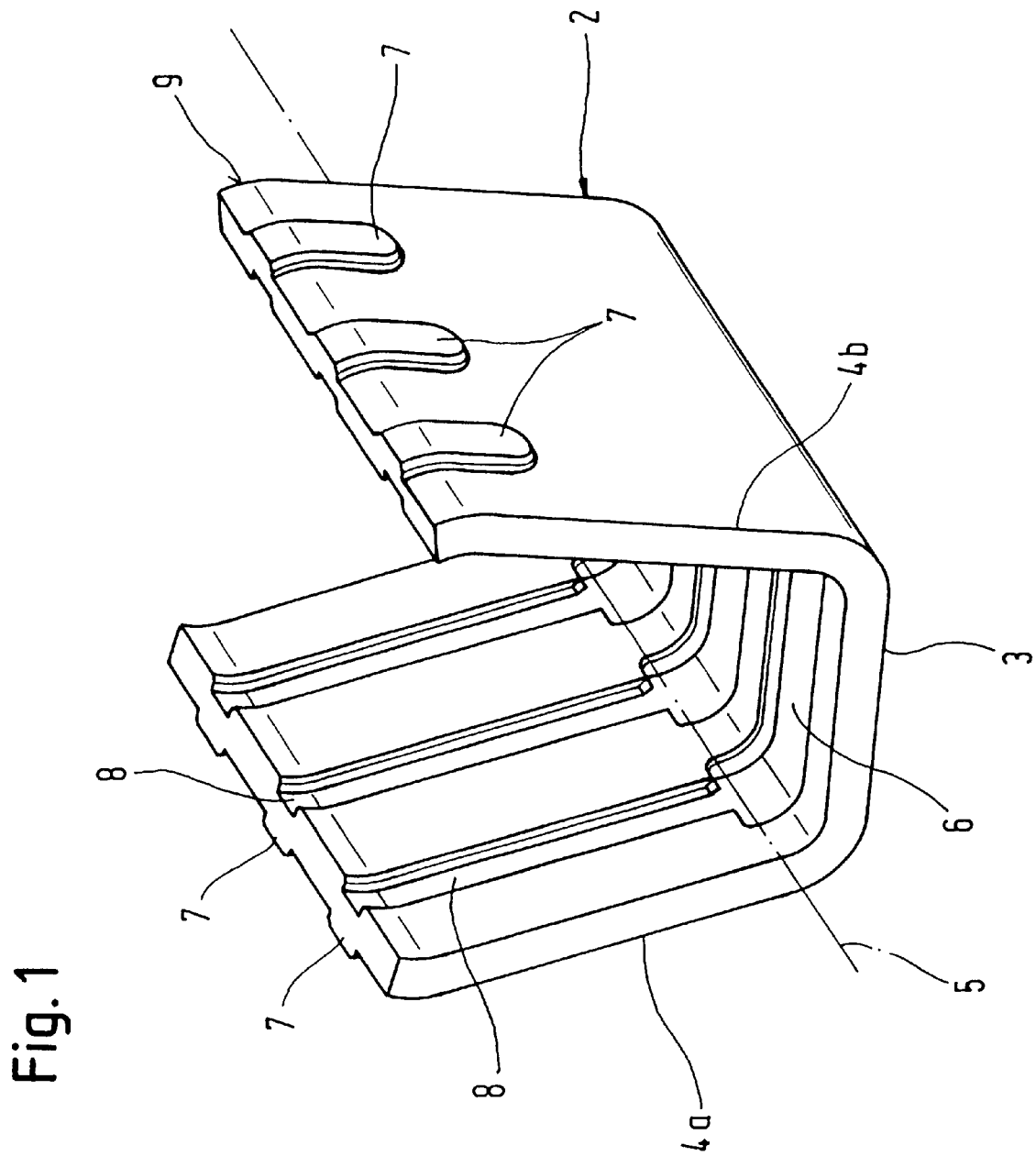
FIG. 1 shows a perspective representation of a crimping ferrule according to the invention.

As can be seen in FIG. 1, the crimp connection comprises a crimping ferrule 2. This crimping ferrule 2 has a U-shaped cross-section, the base of the U representing the base 3 and the legs of the U representing the side plates 4a, 4b. Machined into the base 3 towards the interior of the ferrule and transversely to the longitudinal ferrule axis 5 are grooves 6, which have a rectangular cross-section and are sharp-edged. On the side inner faces of the side plates 4a, 4b (the face directed towards the inside of the ferrule), the grooves 6 are continued by beads 8 over the entire length of the side plates, the bead width being slightly less than the groove width. The outwardly directed faces of the side plates 4a, 4b have regularly spaced ribs, which enclose a rectangular cross-section, their extent along the axial longitudinal direction 5 being chosen such that, after crimping has been carried out, the ribs press the contact part 1 into the corresponding grooves 6, i.e. the width of the ribs 7, in other words along the axial longitudinal direction 5, is slightly less than the groove width. The rib length, the extent from the end 9 of the side plates in the direction of the base 3, is chosen such that, after crimping has been carried out, the ribs disappear completely into the grooves 6, in order in this way not to come into contact with the opposite ribs of the other side plates. Furthermore, the ends 9 of the side plates are slightly rolled forwards inwardly, in order that it is ensured that the side plates 4a, b form spirals after crimping.

Figure 2:
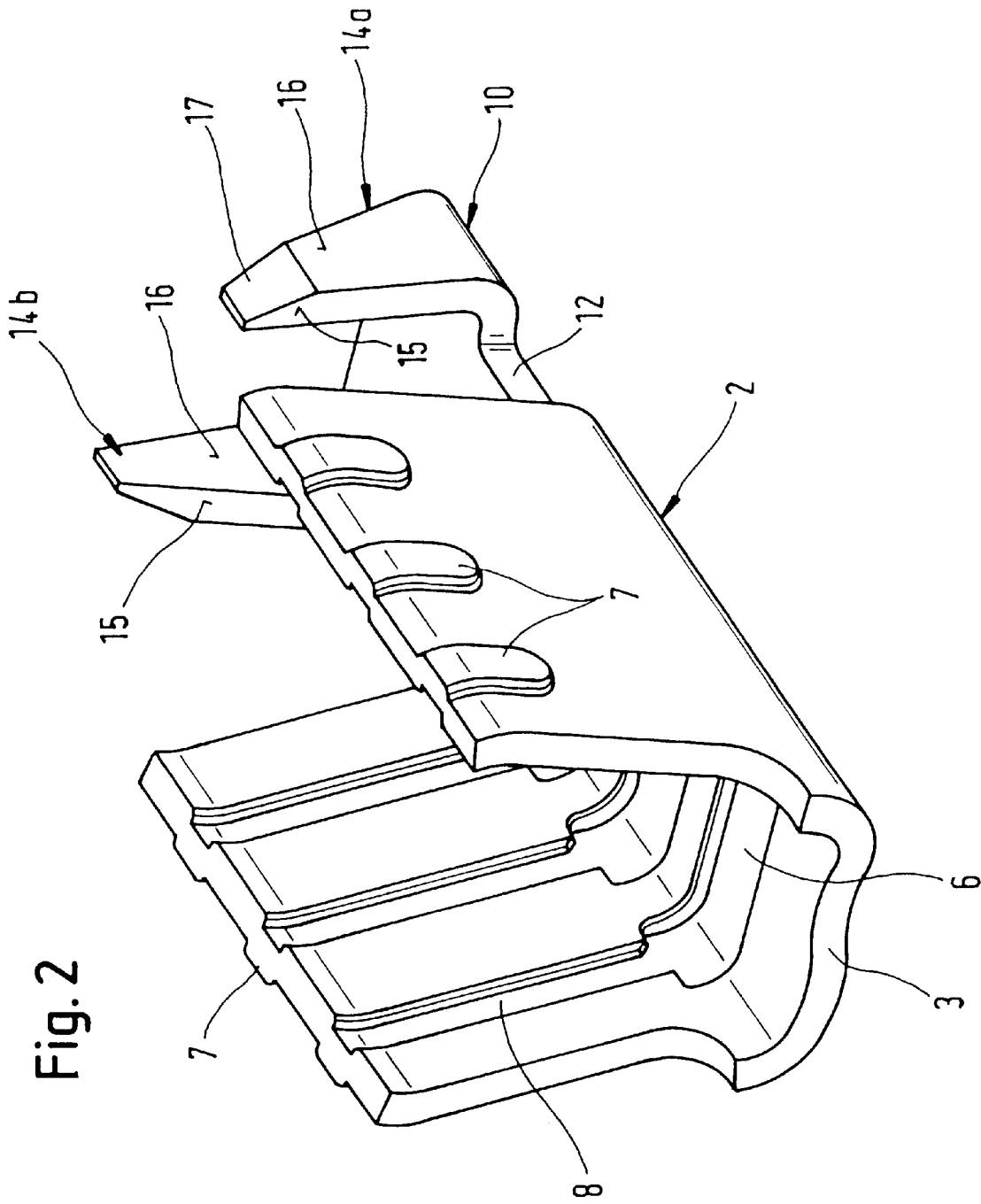
FIG. 2 shows a perspective representation of a second embodiment of a crimping connection according to the invention, with one insulating crimp.

FIG. 2 shows another embodiment of a crimp connection, this additionally having an insulating crimp 10, which is connected to the crimping ferrule 2 by means of a web 12. The insulating crimp 10 likewise has a U-shaped cross-section, the legs of the U being represented here by tines (14a,b). The outwardly and inwardly directed faces 16 are bevelled in the upper part. The end faces 15 of the tines are likewise bevelled, with the result that the end 17 of the tines tapers from two directions, in order on the one hand to be able to pierce better through the cable insulation 11 and on the other hand not to be in the way of the opposite tine after crimping has taken place. In addition to this, the tines are offset with respect to one another. The base of the insulating crimp is of a flat design, in order that the insulating crimp can enclose the conductor firmly in the insulation. The insulating crimp serves for relief from mechanical stresses (tension relief, vibration).

Figure 3:
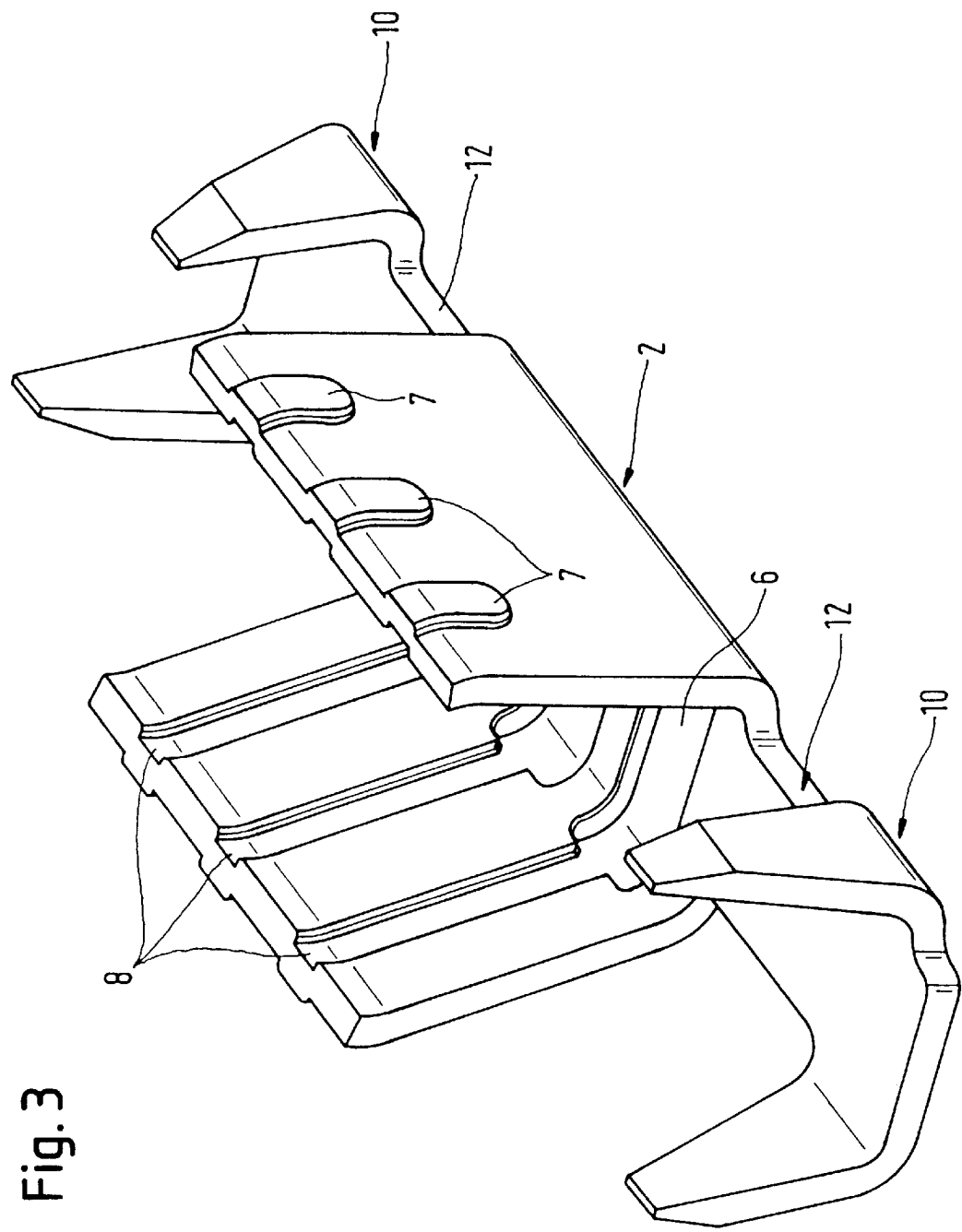
FIG. 3 shows a perspective representation of a third embodiment of a crimp connection according to the invention, with two insulating crimps.

A further embodiment of a crimp connection according to the invention is depicted in FIG. 3. This crimp connection has two insulating crimps 10 along the longitudinal ferrule axis.

Figure 4:
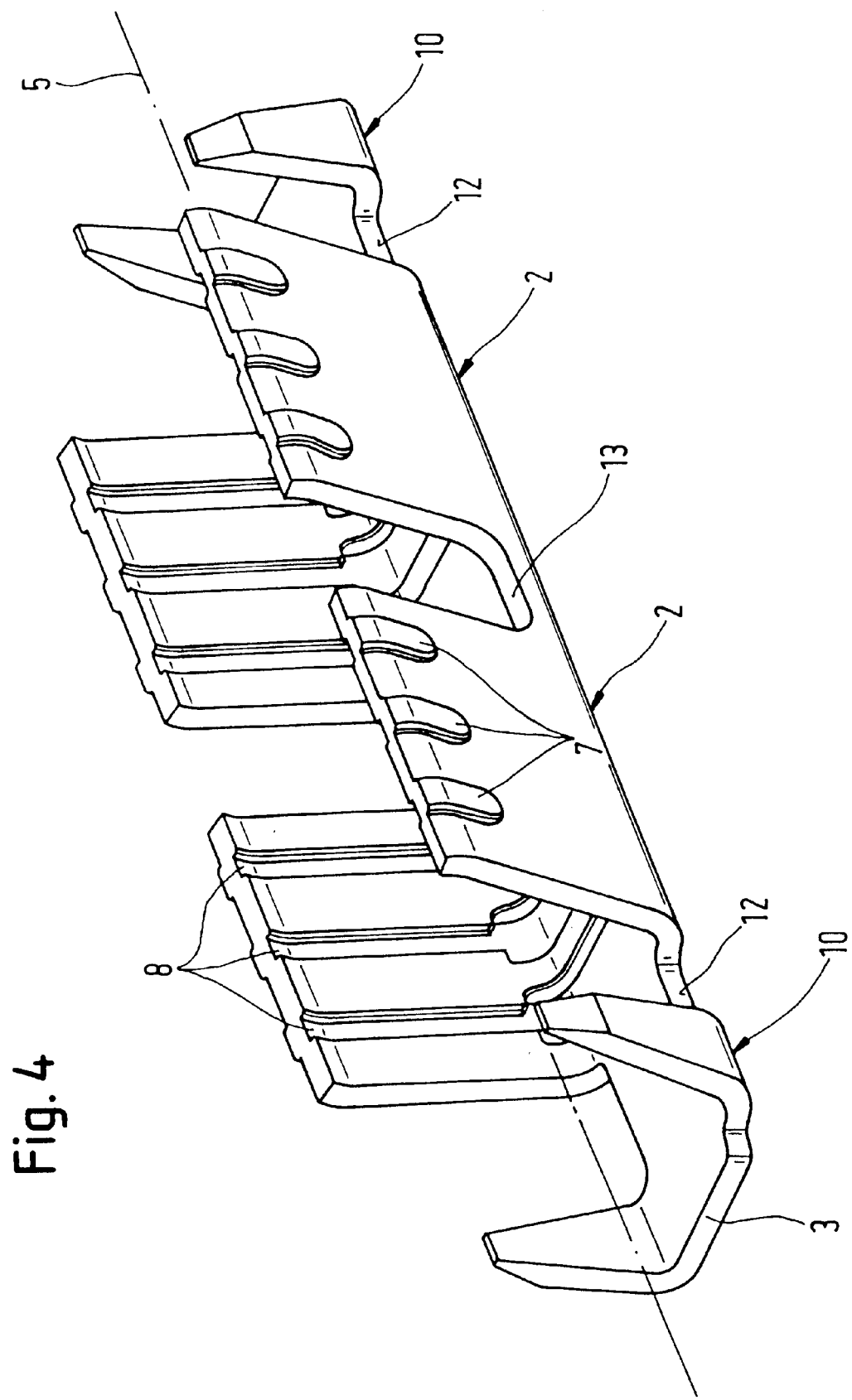
FIG. 4 shows a perspective representation of another embodiment of the crimp connection according to the invention, with two crimping ferrules and two insulating crimps, FIG. shows a perspective representation of a flat-ribbon conductor with insulation-free contacts, on which there are provided crimp connections according to FIG. 2, before and after crimping.

FIG. 4 shows a further embodiment of a crimp connection according to the invention. In a way corresponding to the crimp connection from FIG. 2, this crimp connection is extended along the longitudinal ferrule axis by a further crimping ferrule 2 and an insulating crimp, the two crimping ferrules being connected by means of a transition piece 13.

Figure 5:
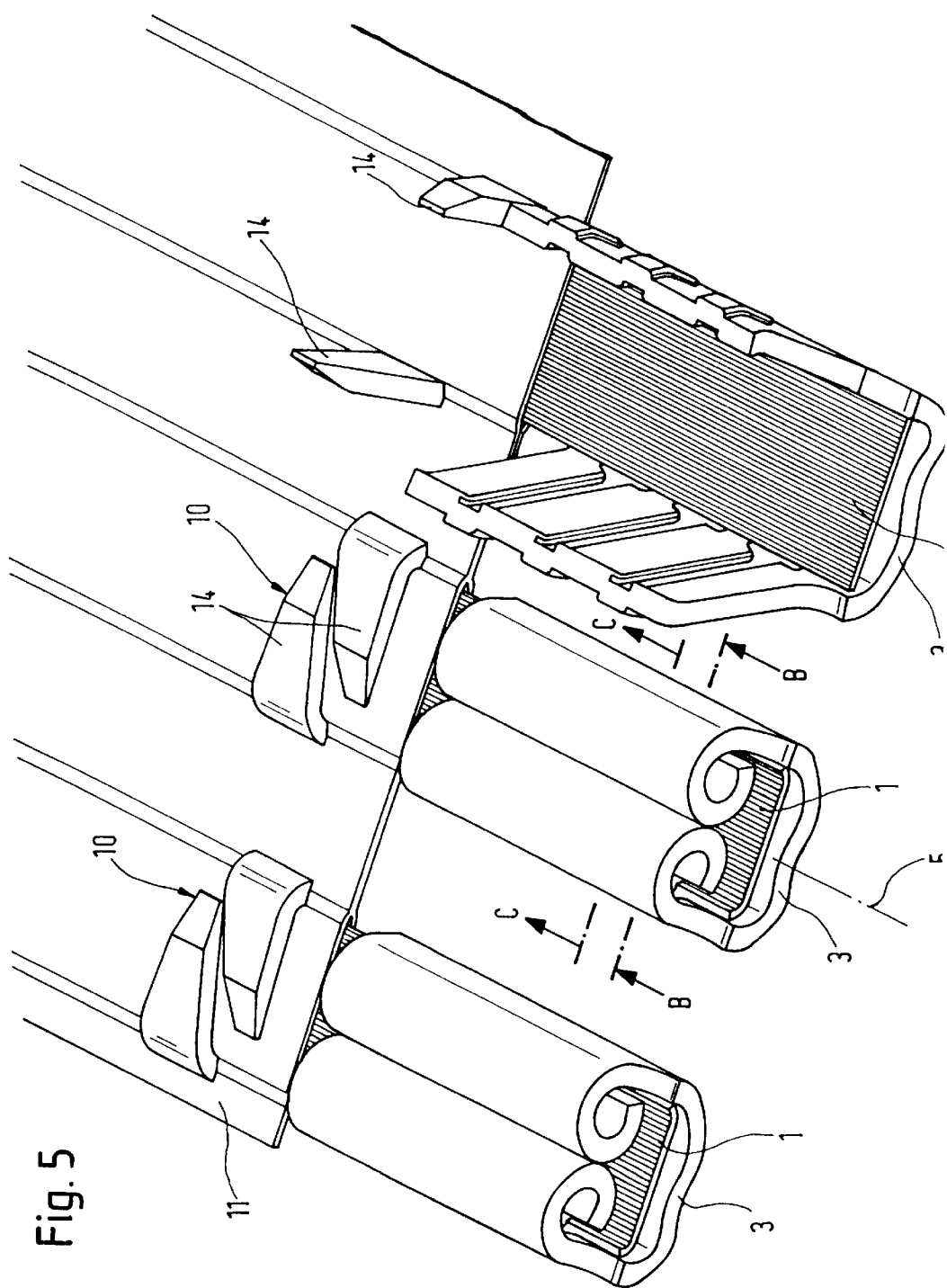

Depicted in FIG. 5 is a flat-ribbon cable, the lengths of conductor being stripped of their insulation at the end. At these ends there are crimp connections corresponding to the design according to FIG. 2, these crimp connections being shown on the one hand in the crimped state and on the other hand in the uncrimped state. As can be seen from the uncrimped crimp connection, the tines 14 pierce the cable insulation. In the crimped state, it can be seen well how the insulating crimp clamps in the cable insulation and the tines come to lie essentially next to one another. Furthermore, it can be seen that the side plates have been rolled in and clamp in the contact part 1 between themselves and the base 3.

Figure 6:
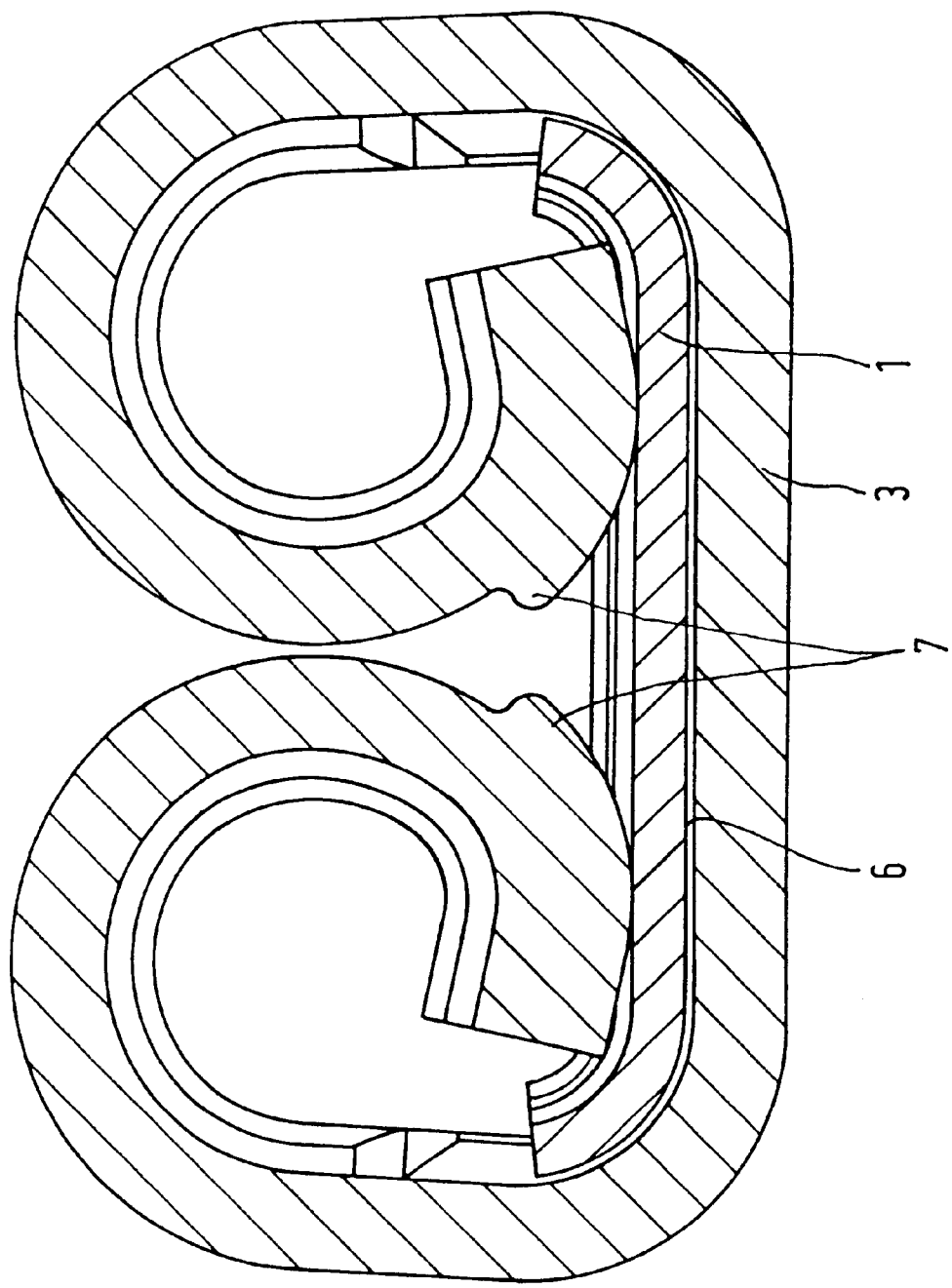
FIG. 6 shows a section through line B—B of FIG. 5, which passes through a rib, the crimp connection being in the crimped state.

FIG. 6 shows a section through the line B—B, this sectional plane been perpendicular to the longitudinal ferrule axis 5. This sectional plane passes through the ribs 7. It can be seen well in this Figure how the ribs engage in the grooves 6 and at the same time press in the contact part 1 there. Furthermore, the ribs are formed to extend only such that they do not touch the ribs of the opposite side.

Figure 7:
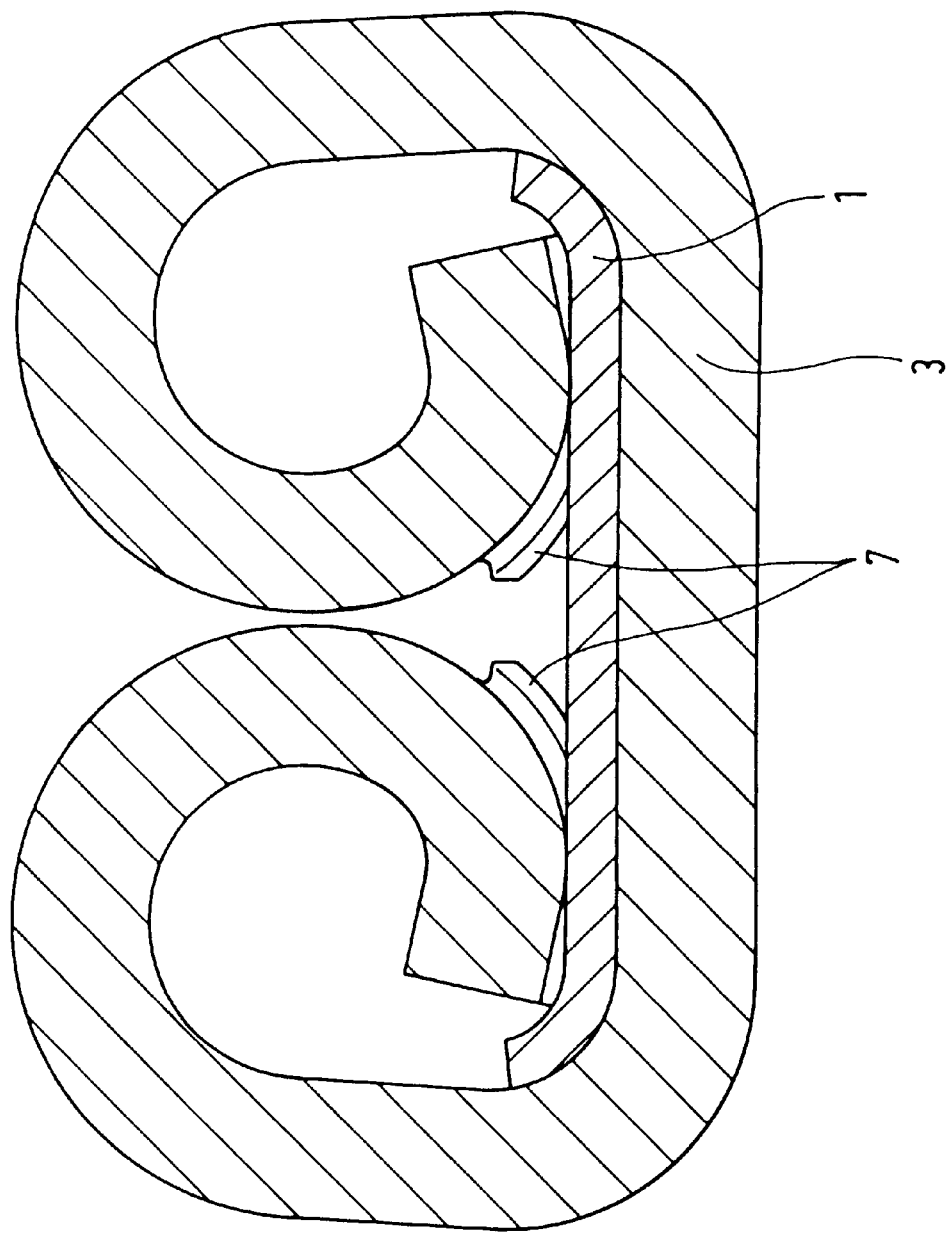
FIG. 7 shows a section through the line C—C of FIG. 5, which runs between the ribs, the crimp connection being in the crimped state.

FIG. 7 is a section through the lines C—C of FIG. 5. This Figure shows very well how the ribs cut into the contact part 1.

A further variant of the embodiment is that the base 3 is continued along the longitudinal ferrule axis either by a male connector or by a female connector.

What is claimed is:

1. A crimp connection between a flexible flat contact part (1) and a crimping ferrule (2) enclosing this contact part (1), characterized in that the crimping ferrule (2) has a base (3) and two side plates (4a, 4b) adjoining the base on opposite sides, the base (3) having at least one groove (6) towards the interior of the ferrule and transversely to a longitudinal ferrule axis (5), and the side plates having ribs (7) thereon sized and shaped to push part of the flat contact part into the at least one groove, the ribs (7) being arranged at free ends of the side plates (4a, 4b) in such a way that, after crimping has taken place and with the side plates (4a, 4b) rolled in towards the interior of the ferrule, said ribs press the flexible contact part (1) into the at least one groove (6) and enter with said contact part into the at least one groove (6).

2. Crimp connection according to claim 1, characterized in that a plurality of the at least one groove (6) and corresponding ribs (7) are arranged on the crimping ferrule (2).

3. Crimp connection according to claim 1, characterized in that the ribs (7) are essentially only of such a length that, after the side plates (4a, 4b) are rolled in towards the interior of the ferrule, the ribs are in contact with the flexible contact part (1).

4. Crimp connection according to claim 1, characterized in that the at least one groove (6) and the ribs (7) have an essentially rectangular cross-section.

5. Crimp connection according to claim 1, characterized in that the ribs (7) are produced by embossing beads (8) in the inner sides of the side plates, in extension of the at least one groove (6).

6. Crimp connection according to claim 1, characterized in that, for better crimping, the free ends (9) of the side plates are inclined towards the interior of the ferrule by rolling forwards.

7. Crimp connection according to claim 1, characterized in that the at least one groove (6) and the ribs (7) are embossed with sharp edges.

8. Crimp connection according to claim 1, characterized in that the flexible, flat contact part (1) is part of a stripped flat-ribbon line or of a flexible printed-circuit board.

9. Crimp connection according to claim 1, characterized in that an insulating crimp (10) for gripping around a cable insulation (11) is provided on one or both sides along the longitudinal ferrule axis (5) of the crimping ferrule (2).

10. Crimp connection according to claim 9, characterized in that the insulating crimp (10) has on either side, transversely to the axial direction (5) two tines (14a, 14b), which extend upwards from the base (3) and are arranged with respect to one another such that, after crimping has taken place, they come to lie essentially next to one another.

11. Crimp connection according to claim 10, characterized in that at least one face (16) and at least one end face (15) of the tines (14a, 14b) are designed such that they taper upwards from the base.

12. Crimp connection according to claim 1, characterized in that two crimping ferrules (2) are arranged one behind the other in the axial direction (5) in one piece together with insulating crimps (10) arranged outside the two ferrules.

13. A flat contact crimping ferrule comprising:

a base section; and two side plates depending from the base section on apposite sides of the base section, each of the two side plates ending in a free edge distal relative to the base section;

wherein, the base section has at least one groove formed inn an inner surface of the base section, the at least one groobe being oriented transverse to a longitudinal axis of the crimping ferrule, each side plate having a rib projection therefrom at the free edge of the side plate, and wherein, when the two side plates are rolled towards the inside of the ferrule for crimping a flat contact inside the ferrule, the ribs on the two side plates are matingly inserted into the at least one froove pressing the flat contact into the at least one groove.

* * * * *